United States Patent
Kandori

(10) Patent No.: US 9,953,625 B2
(45) Date of Patent: Apr. 24, 2018

(54) ELECTROSTATIC CAPACITANCE TRANSDUCER, PROBE, AND SUBJECT INFORMATION ACQUIRING DEVICE

(71) Applicant: CANON KABUSHIKI KAISHA, Tokyo (JP)

(72) Inventor: Atsushi Kandori, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 836 days.

(21) Appl. No.: 14/327,384

(22) Filed: Jul. 9, 2014

(65) Prior Publication Data
US 2015/0016222 A1 Jan. 15, 2015

(30) Foreign Application Priority Data
Jul. 10, 2013 (JP) ................................. 2013-144754

(51) Int. Cl.
*B06B 1/00* (2006.01)
*G10K 9/12* (2006.01)
(Continued)

(52) U.S. Cl.
CPC .............. *G10K 9/12* (2013.01); *B06B 1/0292* (2013.01); *G01S 15/02* (2013.01); *H02N 1/006* (2013.01);
(Continued)

(58) Field of Classification Search
USPC ........................................................ 367/181
See application file for complete search history.

(56) References Cited

U.S. PATENT DOCUMENTS 6,859,984 B2 * 3/2005 Dinet .................... B06B 1/0629
29/25.35
7,349,054 B2 * 3/2008 Kohtaka ............. G02F 1/13452
174/257
(Continued)

FOREIGN PATENT DOCUMENTS

CN 102763149 A 10/2012
EP 2455133 A1 * 5/2012 ........... A61B 8/0841
(Continued)

OTHER PUBLICATIONS

European Search Report and Written Opinion for Application EP14175428 (7 pages).*
(Continued)

*Primary Examiner* — James R Hulka
(74) *Attorney, Agent, or Firm* — Canon U.S.A., Inc. IP Division

(57) ABSTRACT

An electrostatic capacitance transducer includes: multiple elements each having a cell including a first electrode, and a vibrating film including a second electrode, formed across a gap from the first electrode; a first flexible printed circuit having multiple first lines; and a second flexible printed circuit having multiple second lines. Part of the multiple elements are grouped into a first element group, each one thereof being electrically connected to a different one of the first lines. Part of the multiple elements other than the first element group are grouped into a second element group, each one thereof being electrically connected to a different one of the second lines. The intervals between adjacent lines in at least part of the plurality of first and second lines are wider at an opposite side from a connection side where the lines have been connected to the multiple elements, than at the connection side.

16 Claims, 11 Drawing Sheets

(51) Int. Cl.
  *B06B 1/02* (2006.01)
  *G01S 15/02* (2006.01)
  *H02N 1/00* (2006.01)
  *H05K 1/02* (2006.01)
  *H05K 1/14* (2006.01)

(52) U.S. Cl.
  CPC ........... *H05K 1/025* (2013.01); *H05K 1/0228* (2013.01); *H05K 1/0243* (2013.01); *H05K 1/147* (2013.01); *H05K 2201/09227* (2013.01); *H05K 2201/10189* (2013.01)

(56) References Cited

U.S. PATENT DOCUMENTS

| | | | |
|---|---|---|---|
| 7,488,288 B2* | 2/2009 | Tanaka | A61L 38/12 600/437 |
| 9,618,404 B2* | 4/2017 | Kandori | G01L 1/142 |
| 2003/0095227 A1 | 5/2003 | Kohtaka | |
| 2003/0231275 A1 | 12/2003 | Shirato | |
| 2004/0048470 A1 | 3/2004 | Dinet | |
| 2004/0261251 A1* | 12/2004 | Schindel | B06B 1/0292 29/595 |
| 2006/0025691 A1* | 2/2006 | Tanaka | A61B 8/12 600/459 |
| 2008/0200811 A1* | 8/2008 | Wakabayashi | A61B 8/12 600/459 |
| 2011/0018556 A1 | 1/2011 | Le | |
| 2012/0162143 A1* | 6/2012 | Kai | G06F 1/1626 345/177 |
| 2012/0293470 A1 | 11/2012 | Nakata | |
| 2014/0005521 A1* | 1/2014 | Kohler et al. | A61B 8/0841 600/411 |
| 2015/0365017 A1* | 12/2015 | Kandori | G01L 1/142 367/7 |

FOREIGN PATENT DOCUMENTS

| | | |
|---|---|---|
| JP | S55-042661 A | 3/1980 |
| JP | S63-310299 A | 12/1988 |
| JP | H11-295747 A | 10/1999 |
| JP | 2001-198122 A | 7/2001 |
| JP | 2002-153468 A | 5/2002 |
| JP | 2008-006009 A | 1/2008 |
| JP | 2008-526343 A | 7/2008 |
| JP | 2012-222514 A | 11/2012 |
| WO | 2012/066477 A1 | 5/2012 |

OTHER PUBLICATIONS

Capacitive micromachined ultrasonic transducers: fabrication technology, Ultrasonics, Ferroelectrics and Frequency Control, IEEE Transactions on, vol. 52, No. 12, pp. 2242-2258, Dec. 2005.
Chen et al.; "Flexible Tactile Sensors Based on Nanoimprinted Sub-20 NM Piezoelectric Copolymer Nanograss Films" XP032308848; Oct. 28, 2012; IEEE, pp. 1-4.

* cited by examiner

ELECTROSTATIC CAPACITANCE TRANSDUCER, PROBE, AND SUBJECT INFORMATION ACQUIRING DEVICE

BACKGROUND OF THE INVENTION

Field of the Invention

The present invention relates to an electrostatic capacitance transducer, a probe, and a subject information acquiring device, and more particularly relates to an electrostatic capacitance transducer relating to a technology in which at least one of transmission and reception of acoustic waves, and to a probe and subject information acquiring device including the same.

Description of the Related Art

Capacitive micromachined ultrasonic transducers (CMUT), which are a type of electrostatic capacitance transducer, are being studies as a substitute for piezoelectric elements. CMUTs are manufactured using a microelectromechanical systems (MEMS) process employing a semiconductor processing, as described in "Capacitive micromachined ultrasonic transducers: fabrication technology," Ultrasonics, Ferroelectrics and Frequency Control, IEEE Transactions on, vol. 52, no. 12, pp. 2242-2258, December 2005.

A CMUT cell is a configuration where, a vibrating film including one of a pair of electrodes facing each other across a gap serving as a cavity, is supported so as to be capable of vibrating. A configuration unit which includes one or more cells and is electrically independent is called an element. Acoustic waves (typically ultrasound) are transmitted and received in increments of such elements.

Specifically, upon acoustic waves (typically ultrasound) being received in a state where there is potential difference between the two electrics, the vibrating film vibrates, which changes the distance between the two electrodes, thus causing change in the electrostatic capacitance. Current generated by electrostatic induction is output from each element to a reception circuit. The reception circuit converts current values into voltage values, and outputs as received signals.

Also, upon transmission signals of AC voltage being applied across the two electrodes in each element, from a transmission circuit, the vibration film vibrates, whereby acoustic waves can be transmitted from each element.

In an arrangement where multiple elements are disposed so as to form an element array, wiring for electrical connection to transmission/reception circuits is laid for each element. A flexible printed circuit is often used for the wiring, each electrode being connected to the wiring of the flexible printed circuit by way of electrode pads at an end face of the element substrate where the elements are provided. Using a flexible printed circuit enables multiple lines to be extracted in a flexible manner.

SUMMARY OF THE INVENTION

However, simply connecting multiple elements and multiple lines on the flexible printed circuit at the edges of element substrates results in narrow intervals between adjacent lines, which can cause parasitic capacitance between the lines. This can then result in poorer transmission/reception properties (conversion efficiency).

It has been found desirable to provide an electrostatic capacitance transduce with suppressed deterioration in conversion efficiency, by reducing parasitic capacitance between lines.

An electrostatic capacitance transducer includes: a plurality of elements, each of the elements having a cell including a first electrode, and a vibrating film including a second electrode, formed across a gap from the first electrode; a first flexible printed circuit having a plurality of first lines; an a second flexible printed circuit having a plurality of second lines. A part of the plurality of elements are grouped into a first element group, the elements of the first element group and the first lines each being electrically connected. A part of the plurality of elements other than the first element group are grouped into a second element group, the elements of the second element group and the second lines each being electrically connected. The intervals between adjacent lines in at least part of the plurality of first and second lines are wider at an opposite side from a connection side where the lines have been connected to the elements.

Further features of the present invention will become apparent from the following description of exemplary embodiments with reference to the attached drawings.

DESCRIPTION OF THE EMBODIMENTS

Embodiments of the present invention will be described with reference to the drawings. A major feature of the embodiments is that a flexible printed circuit is provided for each element group, and that the interval between lines on the flexible printed circuit is greater on the opposite side from the side at which the lines connect to the elements.

First Embodiment

Configuration of Electrostatic Capacitance Transducer

Figure 1A:
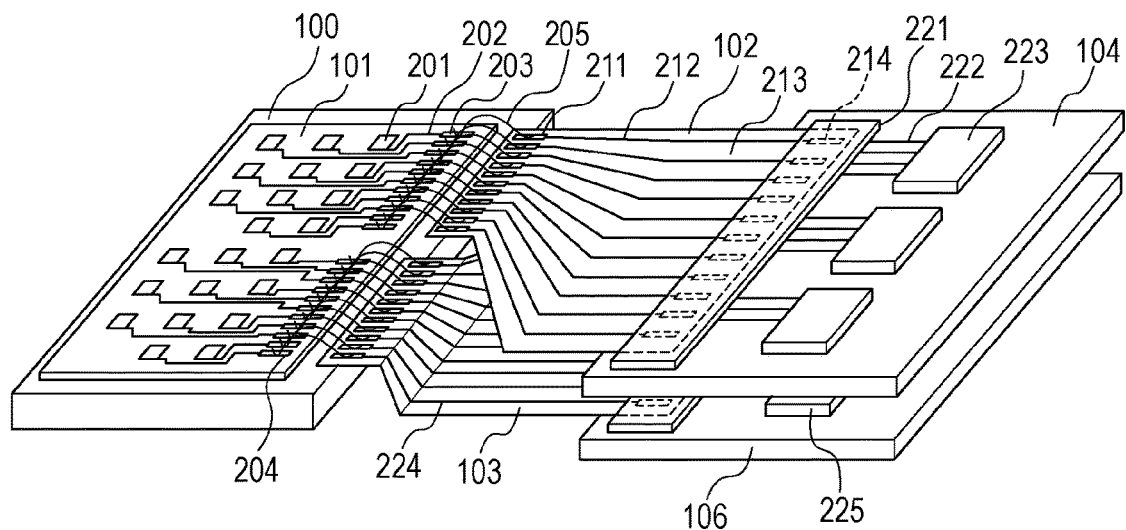
FIGS. 1A through 1C are schematic diagrams for describing an electrostatic capacitance transducer according to a first embodiment.
Figure 1B:
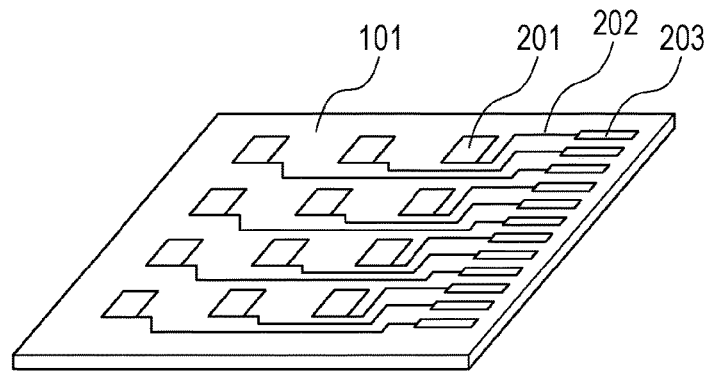
Figure 1C:
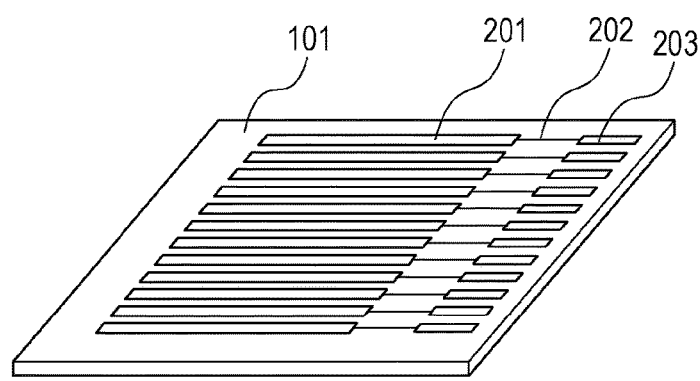

The overall configuration of an electrostatic capacitance transducer according to a first embodiment will be described with reference to FIGS. 1A through 1C. FIG. 1A is a perspective view of the electrostatic capacitance transducer, and FIGS. 1B and 1C are perspective views of an element chip. The electrostatic capacitance transducer according to the present embodiment is capable of at least one of transmission and reception of acoustic waves (typically ultrasound).

The electrostatic capacitance transducer according to the present embodiment includes an element chip 101, a first flexible printed circuit 102, and a second flexible printed circuit 103. The element chip 101 includes multiple elements 201 provided upon a substrate 2. The multiple elements 201 may be arranged in a two-dimensional array such as illustrated in FIG. 1B, or in a one-dimensional array such as illustrated in FIG. 1C. The multiple elements 201 include a first element group (the eleven elements at the upper side in FIG. 1A) connected to first electrode pads 203, and a second element group (the eleven elements at the lower side in FIG. 1A) connected to second electrode pads 204. Detailed configuration of the elements 201 will be described later with reference to FIGS. 2A and 2B.

The first electrode pads 203 on the element chip 101 and wiring pads 211 on the first flexible printed circuit 102 are electrically connected by wires 205. The second electrode pads 204 on the element chip 101 and wiring pads 211 on the second flexible printed circuit 103 are also electrically connected by wires 205. One edge of the first flexible printed circuit 102 and the second flexible printed circuit 103 is fixed on a supporting member 100 on which the element chip 101 is fixed.

The first flexible printed circuit 102 has multiple first lines 212 connected to the multiple wiring pads 211. The first lines 212 are inserted into a connector 221 provided on a first circuit substrate 104 via wiring pads 214. The first lines 212 are connected to the connector 221 provided on the first circuit substrate 104 via wiring pads 214. The second flexible printed circuit 103 has multiple second lines 224 connected to the multiple wiring pads 211. The second lines 224 are inserted into a connector 221 provided on a second circuit substrate 106 via wiring pads 214. The second lines 224 are connected to the connector 221 provided on the first circuit substrate 104 via wiring pads 214. The first lines 212 and second lines 224 are surrounded by an insulating material, so that adjacent lines are insulated from each other.

A first transmission/reception circuit 223 is provided to the first circuit substrate 104 as a first driving circuit, and a second transmission/reception circuit 225 is provided to the second circuit substrate 106 as a second driving circuit. The first and second transmission/reception circuits 223 and 225 are each connected to the connectors 221 by lines 222.

Thus, the multiple elements 201 on the element chip are divided into first and second element groups, and a flexible printed circuit is connected for each element group. The intervals between adjacent first lines 212 on the first flexible printed circuit 102 and the second lines 224 on the second flexible printed circuit 103 are wider at the circuit substrates 104 and 106 as compared to at the element chip 101. This configuration enables parasitic capacitance between lines to be reduced as compared to a configuration where the lines are laid at the same intervals as at the element chip 101.

A configuration may be made where the multiple elements 201 on the element chip 101 are not divided into the first and second element groups, one flexible printed circuit is provided for the multiple elements 201, and the elements 201 are connected to the lines on the flexible printed circuit. In this case as well, the advantages of reduced parasitic capacitance between the lines can be obtained as long as the lines on the flexible printed circuit are laid with broader intervals as compared to at the element chip 101.

Element Configuration

Figure 2A:
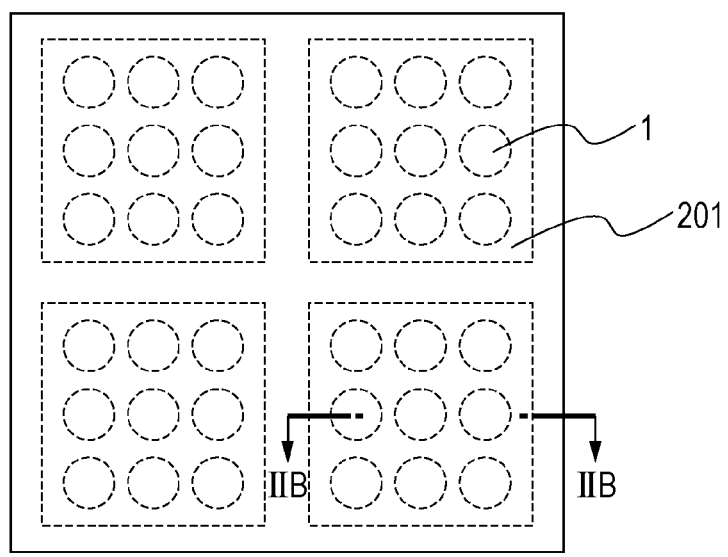
FIGS. 2A and 2B are schematic diagrams illustrating the configuration of an element.
Figure 2B:
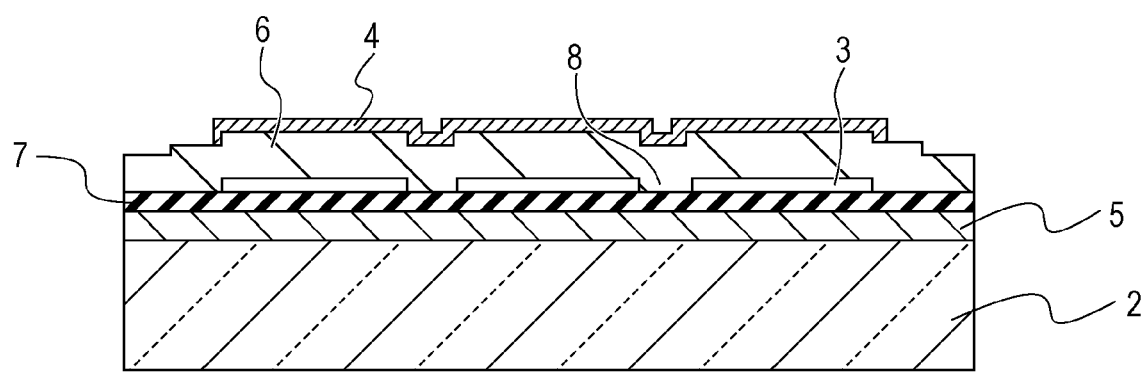

The configuration of the element 201 according to the present embodiment will be described with reference to FIGS. 2A and 2B. FIG. 2A is a plan view illustrating a portion of elements 201 within the element chip 101, and FIG. 2B is a cross-sectional view taken along IIB-IIB in FIG. 2A. The element 201 according to the present embodiment includes cells 1 which are electrically connected with each other. While FIG. 2A illustrates the number of cells 1 as being nine, this number may be just one, or may be any number. The number of elements 201 may be any number, as long as two or more. The shape of the cells is illustrated as being circular in FIG. 2A, but may instead be square, hexagonal, or any other shape. Note that wiring, electrode pads, and so forth to connect the cells and elements are omitted from illustration in FIG. 2A.

Each cell 1 is a smallest unit structure, where a vibrating film including one of a pair of electrodes facing each other across a gap serving as a cavity, is supported so as to be capable of vibrating. Specifically, in FIG. 2B the cell 1 includes a first electrode 5 and a second electrode 4 facing the first electrode 5 across a gap. The first electrode 5 is formed upon the element substrate 2, and an insulating film 7 is formed upon the first electrode 5. The second electrode 4 functions as a vibrating film along with a membrane 6. The membrane 6 is supported by a membrane supporting member 8, and is disposed across a cavity 3 from the insulating film 7.

Each element 201 is an electrically independent structural unit including one or more cells. That is to say, when considering one cell to be one capacitance, the capacitance of multiple cells within an element are connected in parallel, and signals are input and output in increments of elements. The multiple elements 201 are electrically separated from each other by using an insulating film having insulation properties for the membrane 6.

In the present embodiment, the first electrode 5 on the element substrate side functions as a common electrode electrically connected among multiple elements, and the second electrode 4 at the vibrating film side is electrically divided at each of the elements, thereby functioning as individual electrodes where output from each element is extracted. It should be noted, however, that an arrangement may be made in the present invention such that the first electrode 5 is electrically divided at each of the elements so as to be individual electrodes, and the second electrode 4 at the vibrating film side serves as a common electrode conducting among the elements.

While the vibrating film is illustrated in FIG. 2 as being configured of the membrane 6 and second electrode 4, a configuration may be made where the vibrating film is configured at least the second electrode 4 and is capable of vibrating. For example, the vibrating film may be configured including the second electrode 4 alone, or a configuration may be made where the second electrode 4 is interposed between multiple membranes.

Also, the first electrode 5 is directly provided upon the substrate 2 in the present embodiment, but an arrangement may be made where an insulating film is provided between the first electrode 5 and the substrate 2. Further, the insulating film 7 is provided upon the first electrode 5 in the present embodiment, but an arrangement may be made where the insulating film 7 is not provided and the first electrode 5 is exposed.

A silicon substrate, glass substrate, or the like, can be used for the element substrate 2. Metals such as titanium, aluminum, or the like, or aluminum silicon alloys or the like can be used for the first electrode 5 and second electrode 4. A silicon nitride film, silicon oxide film, or the like, can be used for the insulating film 7 and membrane 6. The element 201 can be fabricated using known methods, such as sacrifice layer etching where a cavity is formed by etching a sacrifice layer, joint etching where an active layer of a silicon-on-insulator (SOI) substrate is used as a membrane, and so forth.

Driving the Electrostatic Capacitance Transducer

Returning to FIGS. 1A through 1C, description will be made regarding the principle of driving the electrostatic capacitance transducer according to the present embodiment. In the present embodiment, signals are exchanged between the first transmission/reception circuit 223, and the first element group on the element chip 101. Signals are also exchanged between the second transmission/reception circuit 225 and the second element group. Details of a driving method when transmitting and receiving ultrasonic waves will now be described in detail.

In a case of receiving ultrasonic waves at the electrostatic capacitance transducer, the first electrode 5 and the second electrode 4 are each fixed to predetermined voltage values, so as to generate a potential difference between the first and second electrodes. Specifically, a DC voltage Va is applied to the first electrode 5 serving as the common electrode, and ground potential Vg is applied to the second electrode 4. Note that in the present invention, the ground potential Vg implies a DC reference voltage which the transmission/reception circuits have. This generates a potential difference of Vbias=Va−Vb between the first and second electrodes. Receiving ultrasonic waves in this state causes the vibration film, including the second electrode 4 which is an independent electrode, to vibrate. This vibration causes the distance between the second electrode 4 and first electrode 5 to change, and accordingly the electrostatic capacitance changes. Signals (current) are output for each element from the second electrode 4 in accordance with this change in electrostatic capacitance.

The current is input to the first and second transmission/reception circuits 223 and 225 via the first and second lines 212 and 224 on the first and second flexible printed circuits 102 and 103. The first and second transmission/reception circuits 223 and 225 convert the current into voltage, which is transmitted to an external signal processing unit as reception signals.

When transmitting ultrasonic waves, AC voltage which is transmission signals are supplied from the transmission/reception circuits 223 and 225 to the second electrode 4 in a state where the potential difference is generated between the first electrode 5 and the second electrode 4. Alternatively, voltage obtained by superimposing AC voltage upon DC voltage (i.e., AC voltage where there is no positive/negative inversion) is supplied from the transmission/reception circuits 223 and 225 to the second electrode 4 as transmission signals. The vibration film vibrates by the electrostatic force of the AC voltage, and thus the electrostatic capacitance transducer can transmit ultrasonic waves independently for each element 201.

While FIG. 1A only illustrates the wiring and electrode pads connecting to the second electrode 4, the element chip 101 actually also includes wiring and electrode pads connecting the DC voltage to the first electrode 5 as well. The flexible printed circuits 102 and 103 may also include third wires in addition to the first and second wires, to supply DC voltage to the first electrode 5 from a DC voltage supply unit (omitted from illustration) provided on the circuit substrate or externally.

Next, an example of a transmission/reception circuit used as a driving circuit in the present embodiment will be described. Note that an electrostatic capacitance transducer according to the present embodiment can perform at least one of transmitting and receiving ultrasonic waves. Accordingly, while an example of a transmission/reception circuit will be described as a driving circuit which drives elements, the present embodiment is not restricted to this. Specifically, the circuit may be a circuit which only transmits, or a circuit which only receives.

Transmission/Reception Circuit

Figure 3A:
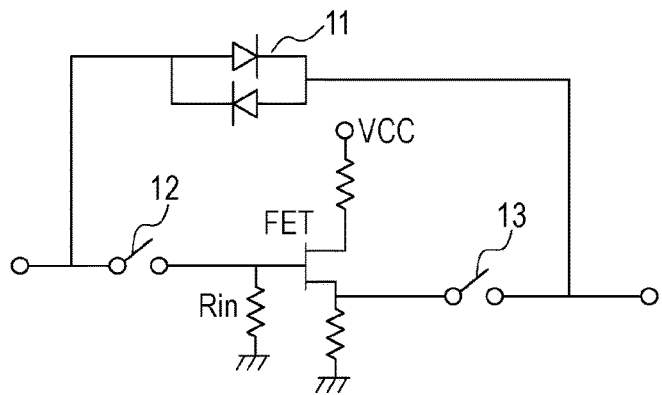
FIGS. 3A through 3D are circuit diagrams illustrating driving circuits.
Figure 3B:
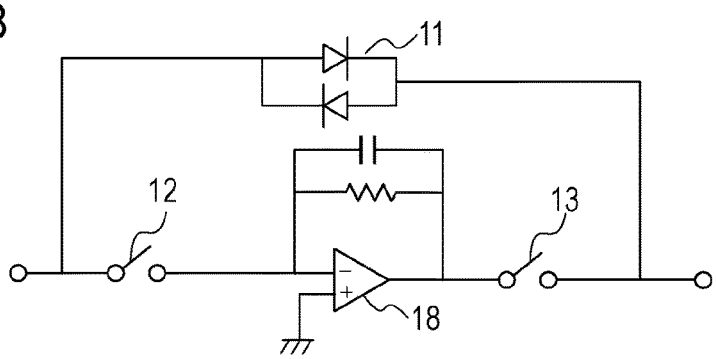

FIGS. 3A through 3D illustrate specific configuration examples of a transmission/reception circuit. FIGS. 3A and 3B are circuits of a configuration where AC voltage is externally supplied as transmission signals.

First, description will be made regarding transmission operations. A transmission signal is externally input to a transmission/reception circuit (from a terminal to the right edge in the drawing). Protection circuits 12 and 13 normally have the input/output lines connected (on), but have a nature such that, when a voltage of several volts or greater is applied, the protection circuits 12 and 13 disconnect the input/output lines (off). Transmission signals are a high-voltage AV voltage in the order of tens to around a hundred volts, so the protection circuit 13 turns off to avoid high voltage from being applied to the reception circuit side which would cause breakage. On the other hand, diodes 11 turn on when voltage equal to or greater than the threshold voltage of the diodes 11 is applied, thereby transmitting the transmission signals to the element chip side. The protection circuit 12 detects the high voltage AC voltage transmission signals, and turns off.

Next, reception operations will be described. A minute current is input to the transmission/reception circuit from the element chip side (terminal at the left side in the drawing). The potential at the terminal at the side of the element chip is lower than the threshold value of the diodes and accordingly is off, and the protection circuit 12 is on, so the current is input to the reception circuit. FIG. 3A illustrates a configuration where a resistor Rin and a field-effect transistor (FET) amplification circuit are used to convert the input current into voltage and output the voltage. A voltage-current converting circuit using a trans-impedance amplifier circuit illustrated in FIG. 3B, employing an operational amplifier 18, may be used for this reception circuit.

Figure 3C:
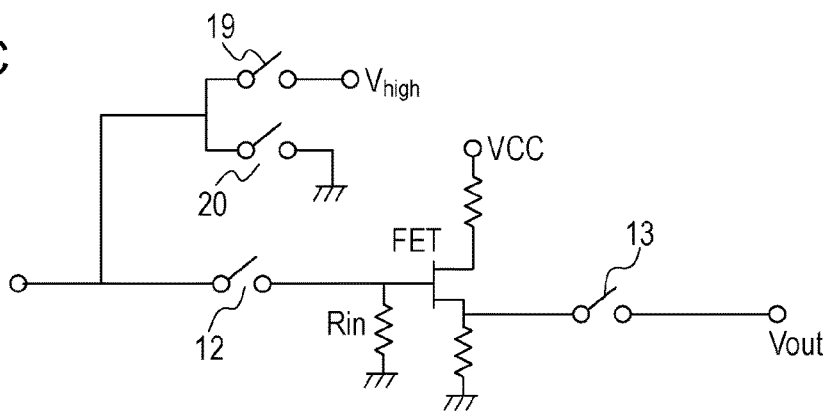
Figure 3D:
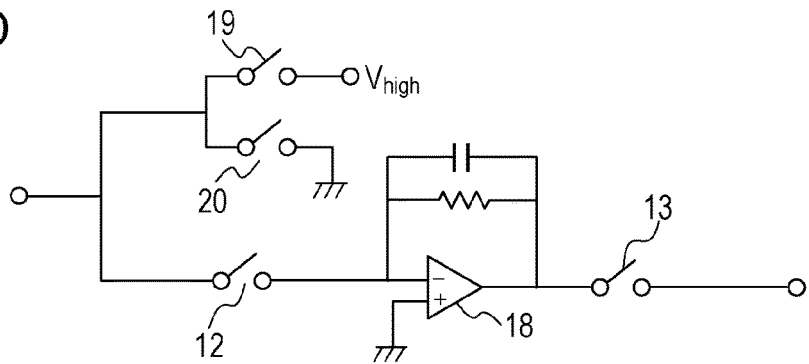

While description has been made with FIGS. 3A and 3B regarding a case where AC voltage is supplied externally as transmission signals, but a configuration may be made such as illustrated in FIGS. 3C and 3D where AC voltage is generated internally as transmission signals. Reference numerals 19 and 20 in FIGS. 3C and 3D denote high-voltage switches. Pulsed AC voltage can be generated when transmitting by turning the high-voltage switch 20 off and turning the high-voltage switch 19 on, to connect to high voltage Vhigh, and then turning the high-voltage switch 19 off and the high-voltage switch 20 on. At this time, the protection circuit 12 is off during the period when high voltage is being generated, so there is no concern of high voltage being applied to the reception circuit side and breakage occurring.

When receiving, both high-voltage switches 19 and 20 are off, so the input current passes through the protection circuit 12 and is input to the reception circuit. A current-voltage converting circuit using the resistor Rin and FET amplification circuit illustrated in FIGS. 3A and 3B, or the trans-impedance amplifier circuit employing the operational amplifier 18, may be used for this reception circuit.

As described above, the present embodiment is configured with the element chip 101 having multiple element groups, and a flexible printed circuit connected to each element group. The lines on the flexible printed circuit are provided such that intervals between adjacent lines are wider at the circuit substrates 104 and 106 as compared to at the element chip 101. The smaller the distance between lines is, the greater the capacitance between the lines is, so this configuration where the pitch of the lines is broadened partway through allows the average distance between the lines to be lengthened.

Accordingly, this configuration allows parasitic capacitance between the lines to be reduced as compared to a case where elements on the element chip 101 are not grouped into element groups, and the lines are simply extended from the multiple elements to a single flexible printed circuit at the same line intervals as on the element chip 101, for example. Wider line intervals at all places on the circuit substrate side is preferable for the lines on the flexible printed circuit, but even partial widening yields effects of reduced parasitic capacitance.

Also, in the present embodiment, the flexible printed circuits are overlapped in the thickness direction thereof, in at least a part of the region at the circuit substrate side, as illustrated in FIG. 1A. This configuration will be described in detail.

The width at which lines can be extracted from the elements is restricted by the width of the element substrate 2 on which the elements are arrayed, and the number of elements arrayed. However, simply increasing the intervals between lines on the flexible printed circuit to reduce parasitic capacitance will increase the overall size of the electrostatic capacitance transducer. Accordingly, the present embodiment overlays multiple flexible printed circuits at a region on the circuit substrate side, thereby enabling the intervals between lines to be widened without increasing the width at the circuit substrate side. If the number of flexible printed circuits connected to one side on the front face of the element chip 101 is N, this enables the wire intervals at the circuit substrate side to by approximately N times that at the element chip side.

Figure 4:
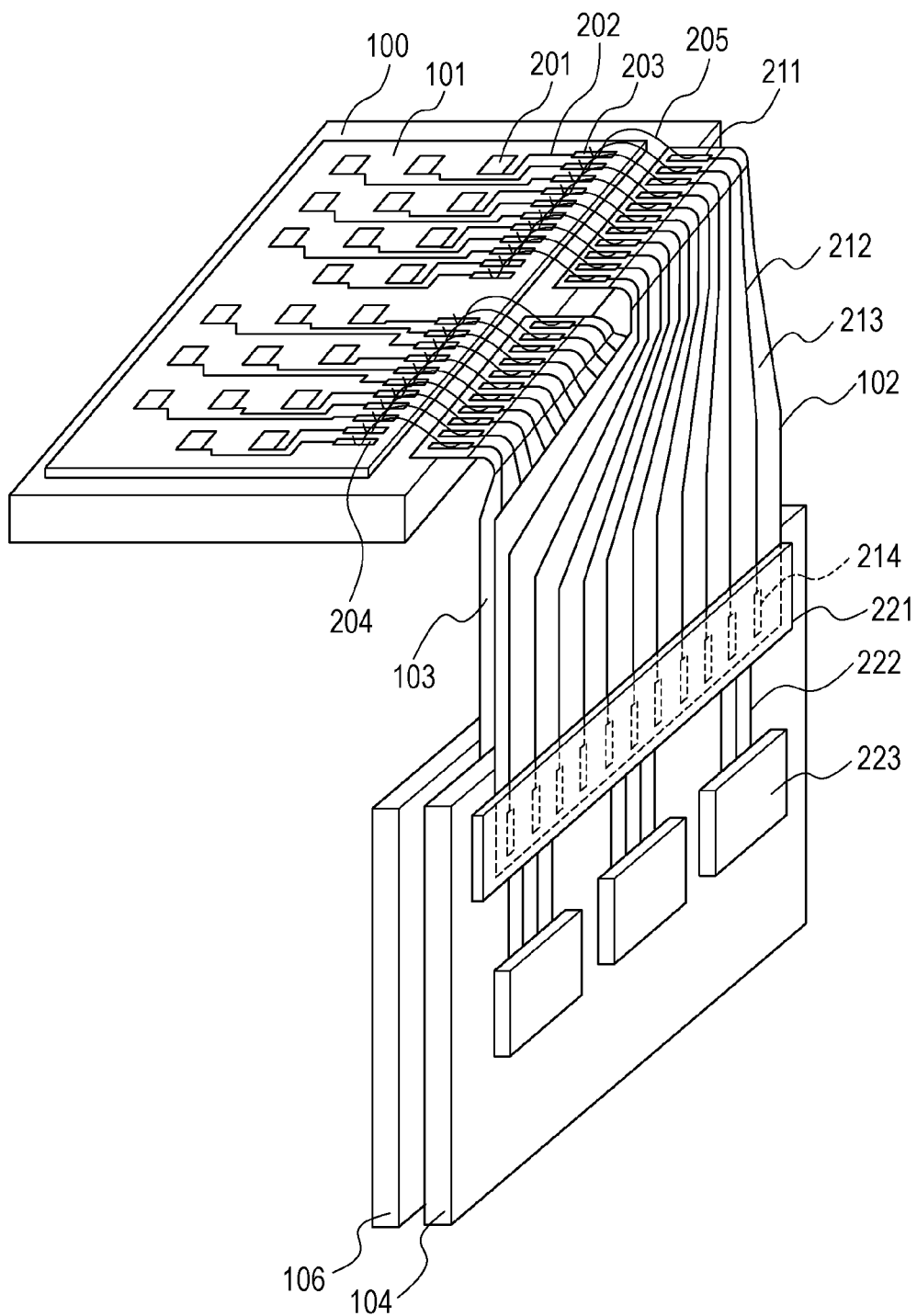
FIG. 4 is a schematic diagram for describing an electrostatic capacitance transducer according to the first embodiment.

Also, the present embodiment enables the flexible printed circuits to be flexibly bent and disposed according to whatever shape (such that the flexible printed circuits are at an angle as to the front face of the element chip), as illustrated in FIG. 4. The first flexible printed circuit 102 and second flexible printed circuit 103 are not overlaid at a bent region (a region where the flexible printed circuits have continuous angle change as to the front face of the element chip). This configuration allows flexible bending without the bent region becoming thick, so an even smaller electrostatic capacitance transducer can be provided.

The number of element groups which can be provided to the element chip 101 is not restricted to two, and may be any number as long as a plurality. The number of flexible printed circuits may correspond to the number of element groups. Further, the flexible printed circuits may extend from both sides of the element chip 101, and not just one end (one side).

Second Embodiment

A second embodiment will be described with reference to FIG. 5. This embodiment relates to the configuration of electrical connection between the element chip and flexible printed circuits. Other configurations are the same as with the first embodiment, and according description will be omitted.

Figure 5A:
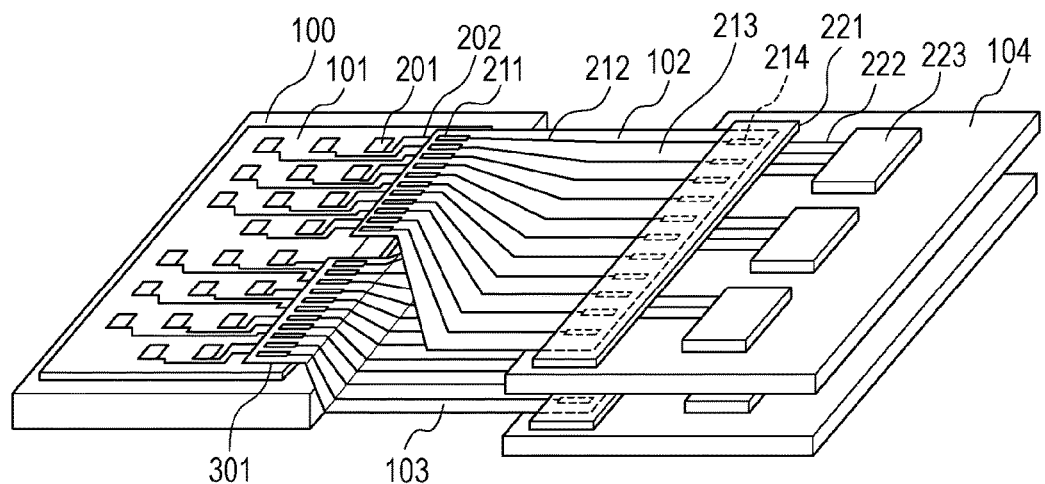
FIGS. 5A through 5C are schematic diagrams for describing an electrostatic capacitance transducer according to a second embodiment.
Figure 5B:
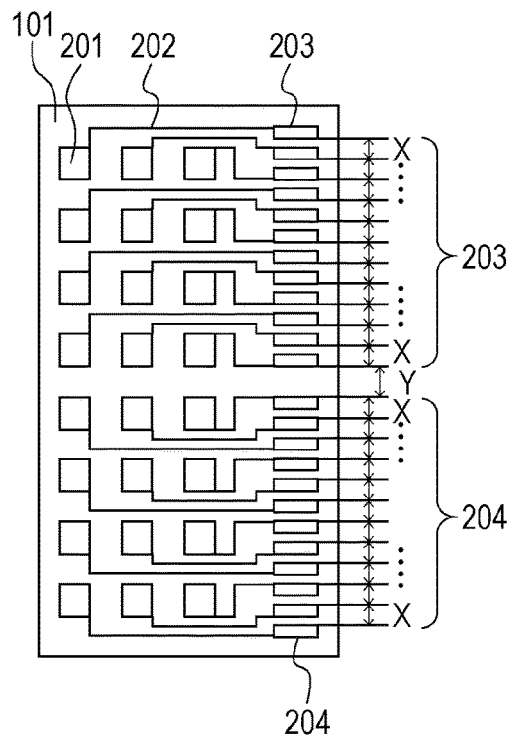
Figure 5C:
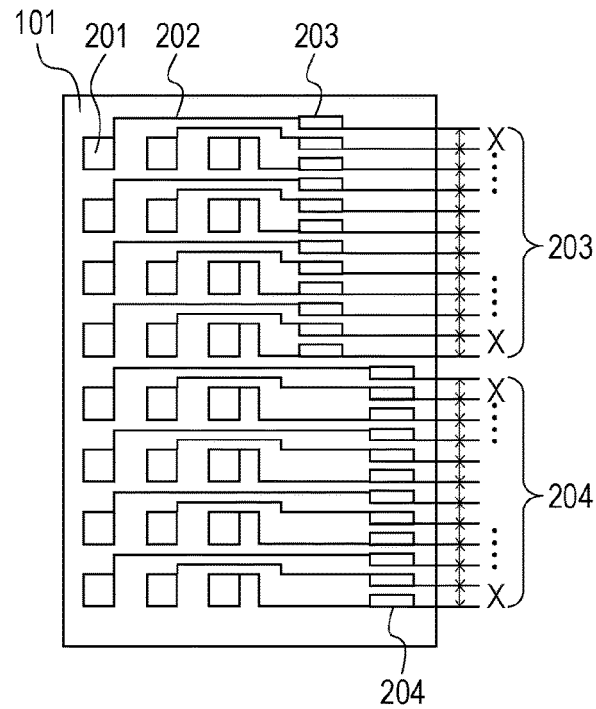

A feature of the present embodiment is that the element chip 101, and the first and second flexible printed circuits 102 and 103, are electrically connected using an anisotropic conductive film (ACF). FIG. 5A is a schematic diagram of an electrostatic capacitance transducer according to the present embodiment, and FIGS. 5B and 5C are plan views of the element chip 101.

In the present embodiment, the element chip 101, and the first and second flexible printed circuits 102 and 103, are connected at an end of the element chip 101. The first and second electrode pads 203 and 204 arrayed at the end of the element chip 101 are electrically connected to wiring pads 211 on the first and second flexible printed circuits 102 and 103 via the ACF 301.

ACF is an insulating thermosetting resin which includes minute conductive metal particles, which can electrically connect between electrodes by applying pinching pressure at the electrodes. That is to say, the first and second electrode pads 203 and 204 and the wiring pads 211 are electrically connected at portions where the ACF 301 is vertically pinched therebetween, but portions not pinched (i.e., between the electrodes) are electrically insulating by the insulating nature of the ACF 301. Applying heat in this state near the electrodes causes the ACF to harden, thereby maintaining the connection state between the electrodes.

Using the ACF 301 for electrical connection reduces the height of the electrical connection portion as compared with a configuration using wires. Accordingly, the height of the electrical connection portion on the element chip 101 is lower, and a smaller electrostatic capacitance transducer can be provided.

Also, the present embodiment enables the first flexible printed circuit 102 and second flexible printed circuit 103 to be independently connected to the element chip 101, unrestricted to being alternatingly fixed thereto. Accordingly, the flexible printed circuits can be easily accurately individually positioned at the first and second electrode pads 203 and 204 on the element chip 101, so the wiring connection portion can be highly reliable.

Of course, an arrangement may be made where the first and second flexible printed circuits 102 and 103 are first integrally fixed, and then connected to the element chip 101. Note however, that in this case, accurately connecting the first and second wiring layers, and the electrode pads 203 arrayed on the element chip 101, without positional deviation, is difficult.

Also, the first and second flexible printed circuits 102 and 103 are connected to the element chip 101 without being connected to each other, and thus can be flexibly bent and placed in accordance with whatever shape. This enables an even smaller electrostatic capacitance transducer to be realized.

Processes for electrical connection will now be described. First, the ACF 301 is disposed upon the second electrode pads 204 arrayed on the element chip 101. Next, the wiring pad 211 of the second flexible printed circuit 103 and the second electrode pads 204 on the element chip 101 are positioned and temporarily fixed. This is then performed in the same way for the first flexible printed circuit 102 as well. Next, pressure and heat is applied. This process crushes the ACF 301 where pinched between the electrode pads 203 and 204 and the wiring pads 211, so that the electrode pads 203 and 204, and the wiring pads 211, are electrically connected. On the other hand, the ACF 301 between adjacent first electrode pads 203 and second electrode pads 204 is not crushed, so the insulating nature, which the ACF itself possesses, electrically insulates therebetween. This heating hardens the resin and the positional relationship of the members is retained. Using the present embodiment as described above enables electrical connection of multiple flexible printed circuits with the electrode pads on the element chip 101 by a simple process.

In the present embodiment, the electrode pads 203 and 204 arrayed at an end of the element chip 101 are in a straight line, as illustrated in FIG. 5B. The electrode pads 203 and electrode pads 204 connected to the same flexible printed circuit are disposed at the same interval X, and electrode pads 203 and electrode pads 204 connected to a different element group are disposed having an interval Y which is greater than X. Accordingly, even in a case of arrayed multiple flexible printed circuits, ACF connection can be performed without insulating regions at the ends of the flexible printed circuits exhibiting mutual interference.

Note however, that the present embodiment is not restricted thusly. For example, different electrode pads 203 and 204 may be positionally offset in the direction in which the lines are extracted, as illustrated in FIG. 5C. Accordingly, there is no need for the space for the interval Y which is wider than the interval X illustrated in FIG. 5B, so the width in which the electrode pads 203 and 204 are arrayed can be suppressed, and a small electrostatic capacitance transducer can be provided.

Third Embodiment

A third embodiment will be described with reference to FIG. 6. This embodiment relates to wiring on multiple flexible printed circuits. Other configurations are the same as in the first and second embodiments, so description thereof will be omitted.

A feature of this embodiment is that first wires 241 of the first flexible printed circuit 102 and second wires 242 of the second flexible printed circuit 103 are in offset regions when viewed in the thickness direction of the first and second flexible printed circuits. FIG. 6 is a transparent view of multiple flexible printed circuits from above the flexible printed circuits.

Figure 6:
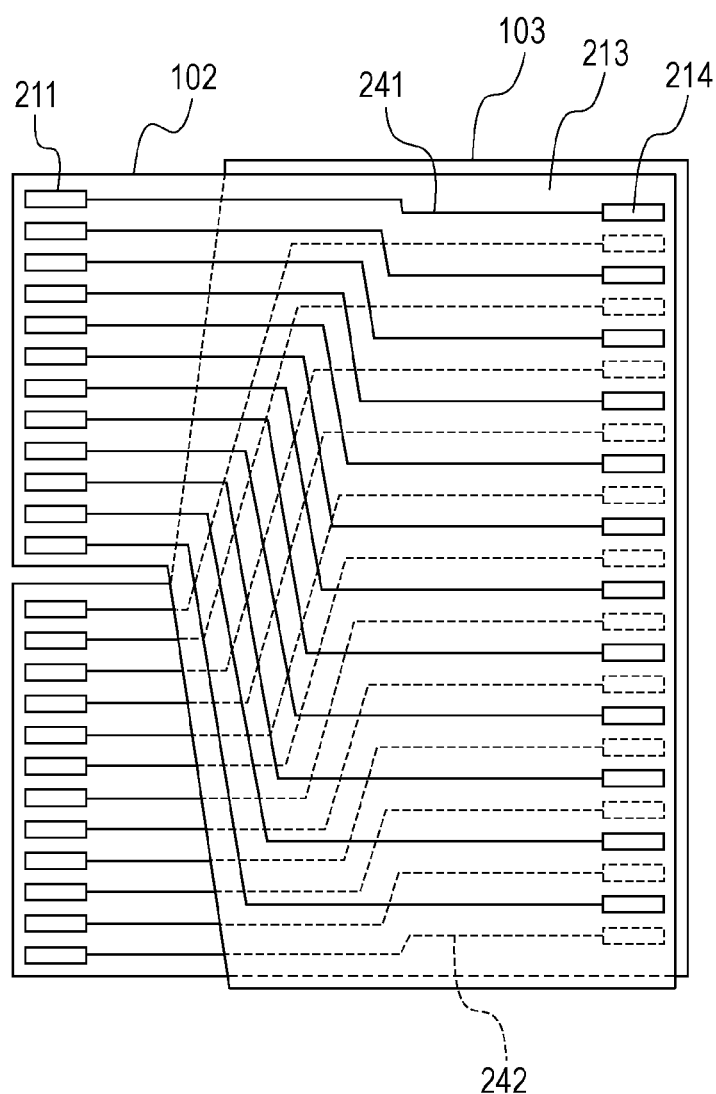
FIG. 6 is a schematic diagram for describing a flexible printed circuit according to a third embodiment.

In FIG. 6, the first flexible printed circuit 102 and the second flexible printed circuit 103 are overlaid at a region on the circuit substrate side. Within this region on the circuit substrate side, the second wires 242 on the second flexible printed circuit 103 are offset as to the first wires 241 on the first flexible printed circuit 102 by around half a wiring interval, in the direction in which the wiring pads 214 are arrayed. That is to say, the orthogonal projection of the first lines 241 onto the second flexible printed circuit 103 is situated such that the first lines 241 are situated between the adjacent second lines 242 in the orthogonal projection thereof. The orthogonal projections of the first lines 241 and second lines 242 are preferably such that the first lines 241 and second lines 242 are alternately arrayed. This configuration enables the distance between the first lines 241 and second lines 242 to be increased, and thus reduce parasitic capacitance between the first and second flexible printed circuits.

Also, in a case where there is a third flexible printed circuit in addition to the first flexible printed circuit 102 and the second flexible printed circuit 103, or even more flexible printed circuits, the positions of lines is preferably offset among at least adjacent flexible printed circuits.

The present embodiment is preferably combined with the second embodiment. The second embodiment enables the wiring pads 211 of the first and second flexible printed circuits 102 and 103 to be situated at the electrode pads 203 and 204 on the element chip 101, so positional relationship can be set with high accuracy. Accordingly, the positional relationship between the wiring pads 211 of the first and second flexible printed circuits 102 and 103 can be positioned with high capacity, so parasitic capacitance between the first and second lines 241 and 242 can be reduced.

Fourth Embodiment

A fourth embodiment will be described with reference to FIG. 7. A feature of the present embodiment is that insulating sheets are provided between multiple flexible printed circuits. Other configurations are the same as in the first through third embodiments, so description thereof will be omitted.

Figure 7:
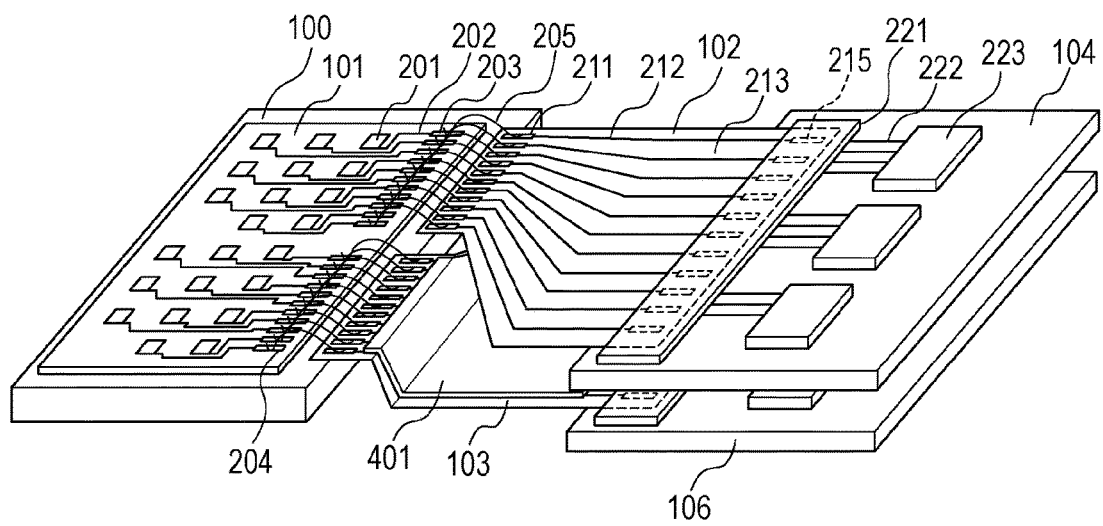
FIG. 7 is a schematic diagram for describing an electrostatic capacitance transducer according to a fourth embodiment.

FIG. 7 is a schematic diagram of an electrostatic capacitance transducer according to the present embodiment. In FIG. 7, an insulating sheet (spacer 401) is disposed between the first flexible printed circuit 102 and the second flexible printed circuit 103. This spacer 401 maintains the distance (space) between the first flexible printed circuit 102 and second flexible printed circuit 103 at a constant distance, which is equal to or greater than the thickness of the spacer 401. Accordingly, the parasitic capacitance between lines provided to each of the first flexible printed circuit 102 and second flexible printed circuit 103 can be suppressed to a small value.

The spacer 401 is preferably fixed to only one of the first flexible printed circuit 102 and second flexible printed circuit 103. Being fixed to only one flexible printed circuit enables positional shift to be easily accommodated for, and the flexible printed circuits to be bent more flexibly.

Fifth Embodiment

A fifth embodiment will be described with reference to FIGS. 8A and 8B. A feature of the present embodiment is that multiple flexible printed circuits are connected to a single circuit substrate. Other configurations are the same as in the first through fourth embodiments, so description thereof will be omitted.

Figure 8A:
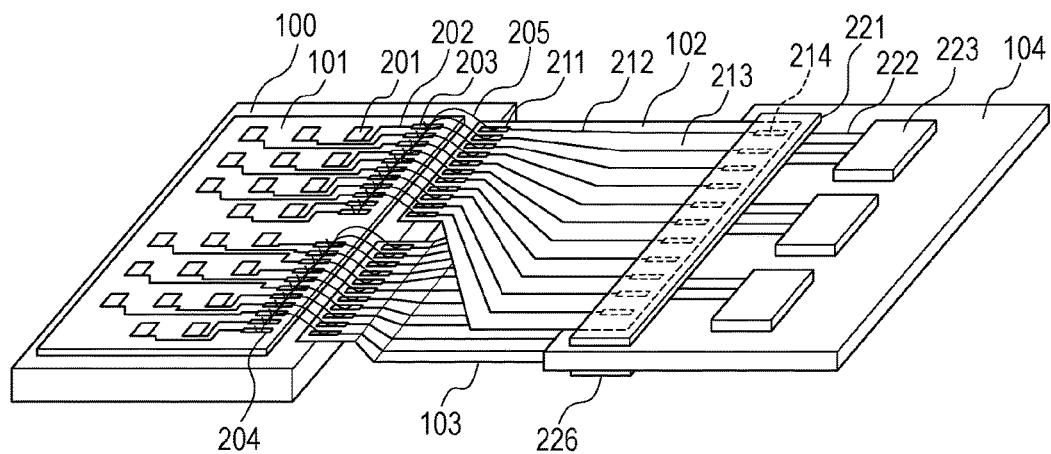
FIGS. 8A and 8B are schematic diagrams for describing an electrostatic capacitance transducer according to a fifth embodiment.
Figure 8B:
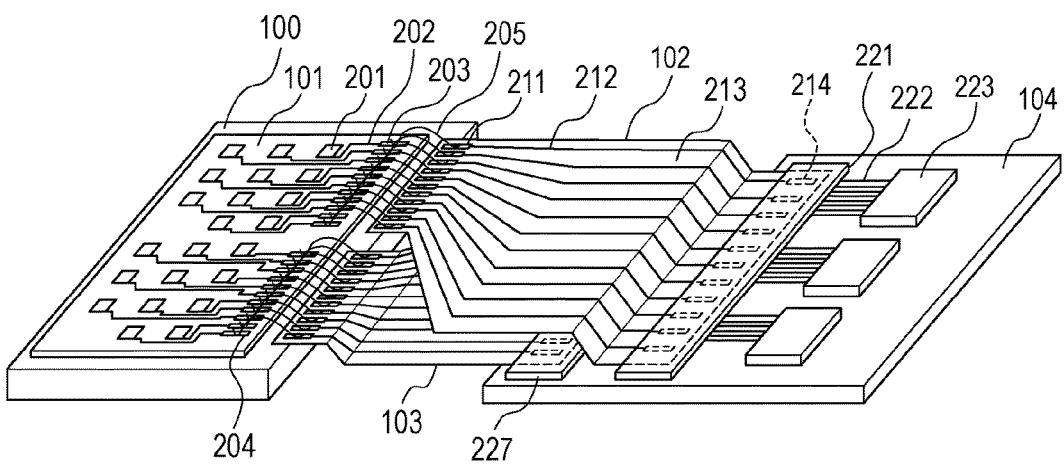

FIGS. 8A and 8B are schematic diagrams of an electrostatic capacitance transducer according to the present embodiment. FIG. 8A illustrates the first and second flexible printed circuits 102 and 103 electrically connected to both faces of the circuit substrate 104. The circuit substrate 104 has connectors 221 and 226, for connecting to the flexible printed circuits, formed on different faces from each other. The first flexible printed circuit 102 is electrically connected to the connector 221 formed on one face (front face) of the circuit substrate 104 via the wiring pads 214. The second flexible printed circuit 103 is electrically connected to the connector 226 formed on the other face (rear face) of the circuit substrate 104 via the wiring pads 214. This configuration enables the thickness of the circuit substrate 104 to be reduced as compared to a configuration where circuit substrate is provided for each flexible printed circuit, and an even smaller electrostatic capacitance transducer can be provided.

Another example of the present embodiment will be described with reference to FIG. 8B. FIG. 8B illustrates connectors 221 and 227, arrayed in two rows on one face of the circuit substrate 104, so that there are two rows of wiring pads arrayed in a direction orthogonal to the direction in which the wires extend. The connectors 221 and 227 are arrayed in the direction in which the wires extend. The connector 221 is electrically connected to the first transmission/reception circuit 223 on the face to which the connector 221 is provided, via lines 222. On the other hand, the connector 227 is electrically connected to an unshown transmission/reception circuit on the rear side from the face to which the connector 227 is provided, via through wiring.

This configuration enables the connection portions between the circuit substrate 104 and the flexible printed circuits to be situated on just one face. This allows the height of the connector portion to be reduced as compared to the configuration illustrated in FIG. 8A where connectors are formed on both faces, and accordingly a smaller electrostatic capacitance transducer can be provided. Also, arraying the connectors on one face of the circuit substrate 104 facilitates assembly, so an electrostatic capacitance transducer can be provided with few restrictions regarding placement regarding circuit substrates.

While the present embodiment has been described with regard to a configuration using connectors for electrical connection between the circuit substrate 104 and the first and second flexible printed circuits 102 and 103, but the present embodiment is not restricted thusly, and connection by ACF or wires can also be made. In a case of using wires, the height of the connection portion of the circuit substrate 104 and the first and second flexible printed circuits 102 and 103 can be reduced. Using ACF can further markedly reduce the height of the connection portion of the circuit substrate 104 and the first and second flexible printed circuits 102 and 103, and accordingly, an even smaller electrostatic capacitance transducer can be provided.

Sixth Embodiment

A sixth embodiment will be described with reference to FIG. 9. A feature of the present embodiment is the presence of a third flexible printed circuit, different from the first and second flexible printed circuits. Other configurations are the same as in the first through fifth embodiments, so description thereof will be omitted.

Figure 9:
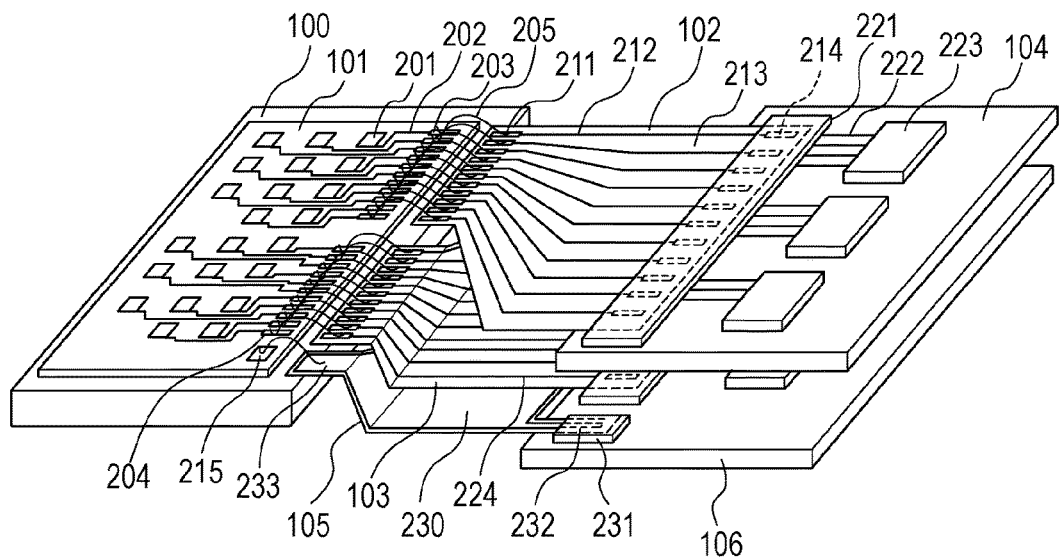
FIG. 9 is a schematic diagram for describing an electrostatic capacitance transducer according to a sixth embodiment.

FIG. 9 is a schematic diagram of an electrostatic capacitance transducer according to the present embodiment. FIG. 9 illustrates a third flexible printed circuit 105 disposed beneath the first and second flexible printed circuits. A third line 230 on the third flexible printed circuit 105 is electrically connected to the second electrode 4 which is a common electrode of the element chip 101, via wiring pads 215. The third line 230 on the third flexible printed circuit 105 is also electrically connected to a connector 231 connected to an unshown DC voltage supply unit provided to the circuit substrate 104 or externally, via wiring pads 232. That is, the third line 230 supplies DC voltage Va to the common electrode of the element chip 101.

Also, at the time of a transmission/reception signal (one of a transmission signal and reception signal) reaching the first and second lines 212 and 224, a return signal corresponding to the transmission/reception signal is input to the third line 230. The first and second lines 212 and 224 which transmit this signal, and the third line 230 functioning as a return signal line, are preferably laid as far away from each other, in order for transmission/reception signals to be transmitted without deterioration.

This configuration of the present embodiment enables the third line 230 to be disposed facing the first and second lines 212 and 224 through which the transmission/reception signals pass. Accordingly, deterioration in transmission characteristics of the transmission/reception signals between the element chip 101 and the first and second transmission/reception circuits 223 and 225 can be suppressed.

The position of the third flexible printed circuit 105 is illustrated in FIG. 9 as being beneath the first and second flexible printed circuits 102 and 103, but the present embodiment is not restricted thusly. The third flexible printed circuit 105 may be disposed above the first and second flexible printed circuits 102 and 103, or may be disposed between the first and second flexible printed circuits 102 and 103.

Seventh Embodiment

A seventh embodiment will be described with reference to FIG. 10. The present embodiment has a fourth flexible printed circuit between the first and second flexible printed circuits. Other configurations are the same as in the first through sixth embodiments, so description thereof will be omitted.

Figure 10:
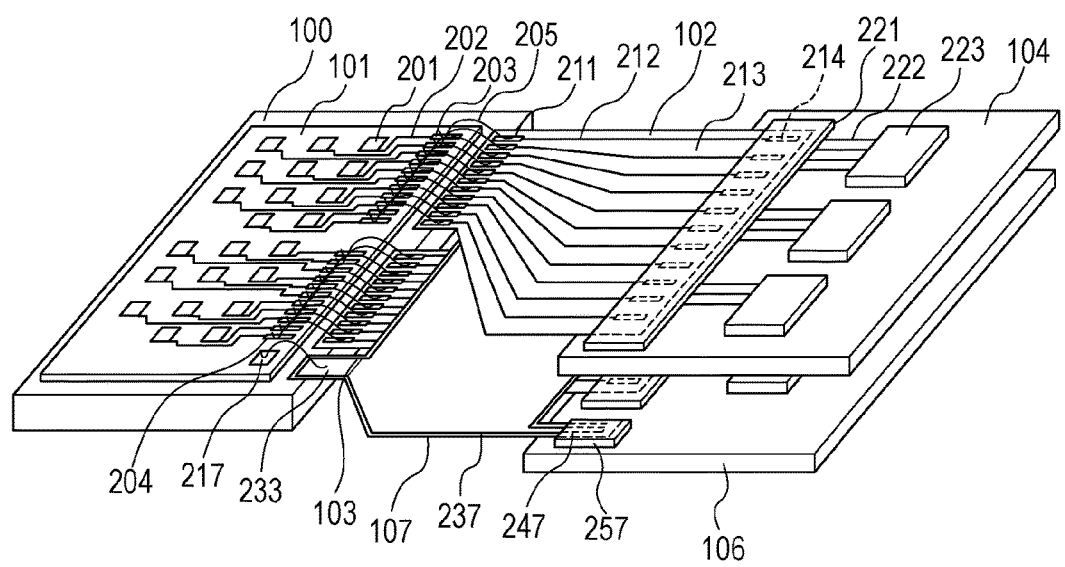
FIG. 10 is a schematic diagram for describing an electrostatic capacitance transducer according to a seventh embodiment.

FIG. 10 is a schematic diagram of an electrostatic capacitance transducer according to the present embodiment. FIG. 10 illustrates a fourth flexible printed circuit 107 between the first flexible printed circuit 102 and second flexible printed circuit 103. The fourth flexible printed circuit 107 has a fourth line 237 of the same potential covering the entire face, and is covered by an insulating film.

The fourth line 237 on the fourth flexible printed circuit 107 is connected to the element substrates via pads 217 on the element chip 101. The fourth line 237 is connected to a predetermined reference potential of the first circuit substrate 104 (typically, ground potential Vg), via wiring pads 247 and a connector 257.

This fourth flexible printed circuit 107 electrostatically shields between the first flexible printed circuit 102 and second flexible printed circuit 103 by the fourth line 237 fixed to the predetermined reference potential. Accordingly, parasitic capacitance occurring between the first lines 212 on the first flexible printed circuit 102 and the second lines 224 on the second flexible printed circuit 103 can be almost completely done away with. Thus, deterioration in transmission characteristics of transmission/reception signals between the element chip 101 and the transmission/reception circuits 223 and 225 can be suppressed.

Eighth Embodiment

An eighth embodiment will be described with reference to FIG. 11. The present embodiment differs from the first through seventh embodiments in that the first flexible printed circuit 102 and the second flexible printed circuit 103 are disposed on different end faces (side faces) of the element chip 101. Other configurations are the same as in the first through seventh embodiments, so description thereof will be omitted.

Figure 11:
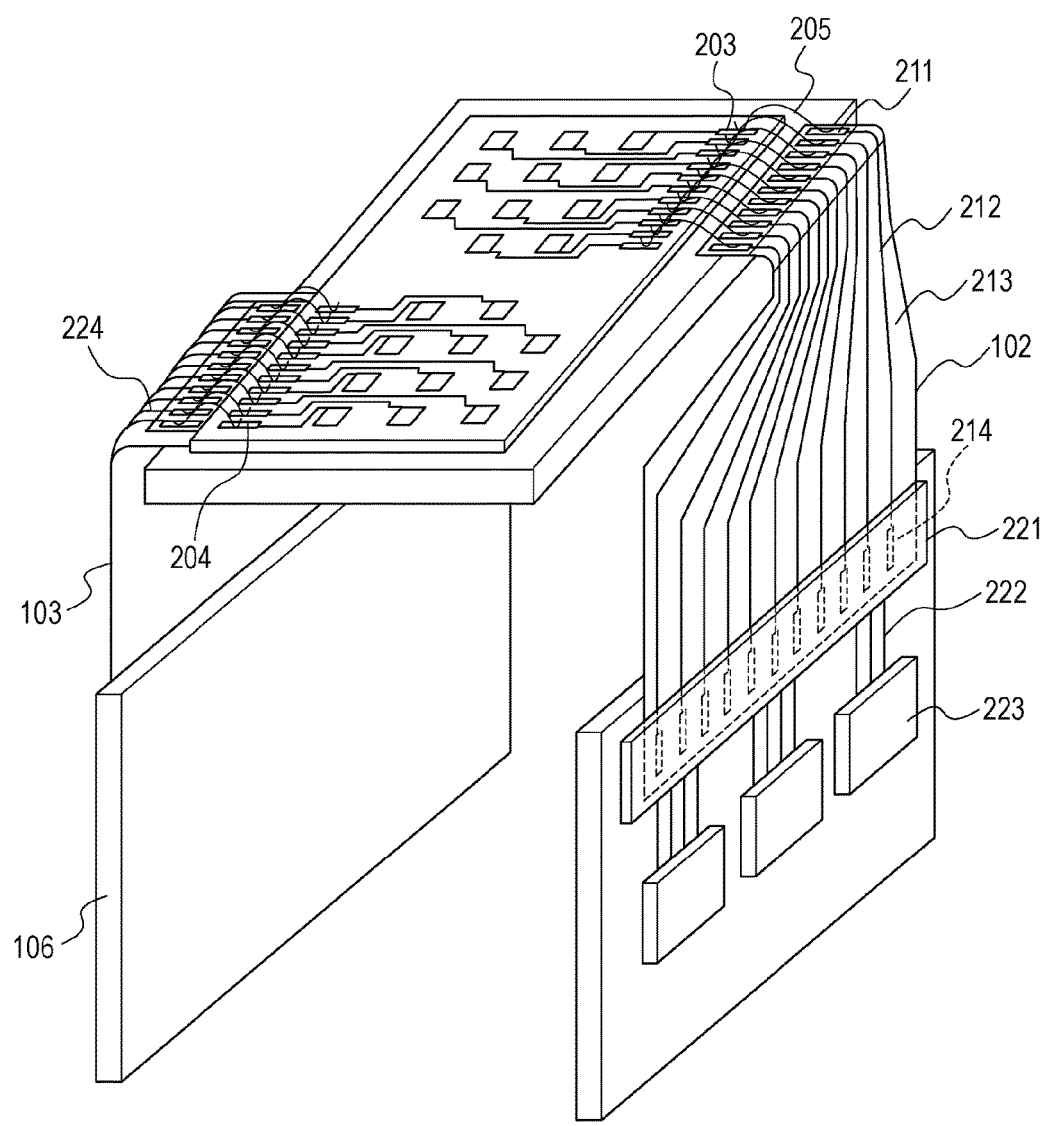
FIG. 11 is a schematic diagram for describing an electrostatic capacitance transducer according to an eighth embodiment.

FIG. 11 is a schematic diagram of an electrostatic capacitance transducer according to the present embodiment. As illustrated in FIG. 11, the first lines 212 of the first flexible printed circuit 102 are electrically connected to the first electrode pads 203 of the first element group, at a first end face side of the element chip 101. In the same way, the second lines 224 of the second flexible printed circuit 103 are electrically connected to the second electrode pads 204 of the second element group, at a second end face side of the element chip 101.

This embodiment also enables the intervals between the first lines 212 and between the second lines 224 to be widened, thereby reducing parasitic capacitance between the lines. Further, the width of the circuit substrate can be reduced in the direction in which the first electrode pads 203 and 204 are arrayed, and accordingly a small electrostatic capacitance transducer can be provided.

Ninth Embodiment

The electrostatic capacitance transducers described in the first through eighth embodiments above can be applied to a subject information acquiring device using acoustic waves including ultrasonic waves. Acoustic waves from a subject are received at the electrostatic capacitance transducer, and electric signals output from the electrostatic capacitance transducer are used to obtain subject information. Subject information which can be obtained includes information reflecting optical property values of the subject, such as optical absorption coefficients, and information reflecting difference in acoustic impedance.

Figure 12A:
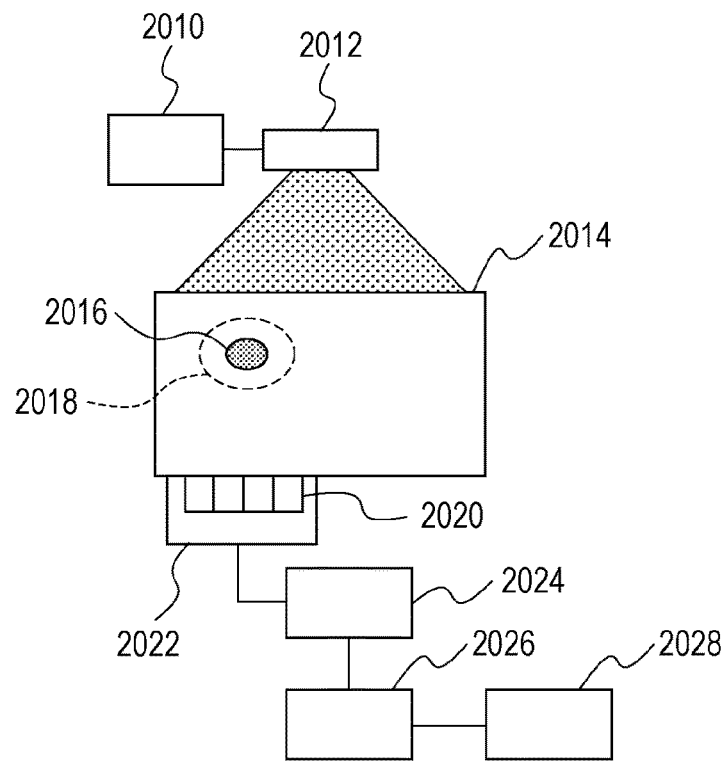
FIGS. 12A and 12B are schematic diagrams for describing a subject information acquiring device.

FIG. 12A is a schematic diagram illustrating a subject information acquiring device using photoacoustic effects. Pulse light emitted from a light source 2010 passes through optical members 2012, such as lenses, mirrors, optical fiber, and so forth, and a subject 2014 is irradiated by this pulse light. An optical absorbent 2016 within the subject 2014 absorbs the energy of the pulse light, and generates photoacoustic waves 2018, which are acoustic waves.

The electrostatic capacitance transducer 2020 receives the photoacoustic waves 2018. Note that the electrostatic capacitance transducer 2020 is accommodated within housing 2022, and a probe is configured including at least the housing 2022 and electrostatic capacitance transducer 2020. The probe is connected to a signal processing unit 2024. Electric signals output from the electrostatic capacitance transducer 2020 are transmitted to the signal processing unit 2024.

The signal processing unit 2024 performs signal processing on the input electric signals such as A/D conversion and the like, and outputs the processed signals to a data processing unit 2026. The data processing unit 2026 uses the input signals to acquire subject information (property information reflecting optical property values of the subject, such as optical absorption coefficients), as image data. Note that the signal processing unit 2024 and data processing unit 2026 may be collectively referred to as "processing unit". A display unit 2028 displays images based on image data input from the data processing unit 2026.

Figure 12B:
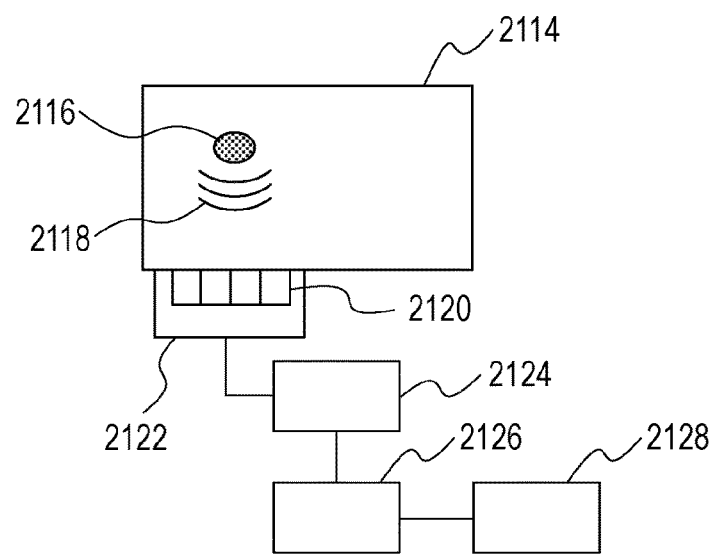

FIG. 12B illustrates a subject information acquiring device such as an ultrasonic echo diagnosis apparatus using reflection of acoustic waves. Acoustic waves, transmitted to the subject 2114 from the electrostatic capacitance transducer 2120 within the probe based on transmission signals from a signal processing unit 2124, are reflected off a reflective object 2116. The electrostatic capacitance transducer 2120 receives the reflected acoustic waves 2118, converts into electric signals, and outputs to the signal processing unit 2124. The signal processing unit 2124 performs signal processing on the input electric signals such as A/D conversion and amplification and the like, and outputs the processed signals to a data processing unit 2126. The data processing unit 2126 uses the input signals to acquire subject information (property information reflecting difference in acoustic impedance), as image data. Note that the signal processing unit 2124 and data processing unit 2126 may be collectively referred to as "processing unit". A display unit 2128 displays images based on image data input from the data processing unit 2126.

The probe may either be a mechanically scanning type or a hand-held type which a user such as a physician or technician or the like moves over the subject. In a case of using reflected waves as in the case in FIG. 12B, the probe transmitting acoustic waves may be provided separately from the receiving probe.

Further, an arrangement may be made where both functions of the devices illustrated in FIGS. 12A and 12B are included, so that both subject information reflecting acoustic property values of the subject, and subject information reflecting difference in acoustic impedance, can be acquired. In this case, the electrostatic capacitance transducer 2020 illustrated in FIG. 20A may transmit acoustic waves and receive reflected waves, rather than only receiving photoacoustic waves.

Accordingly, the electrostatic capacitance transducer according to the first through eight embodiments can be applied to apparatuses using photoacoustic effects and ultrasonic echo. Property deterioration of signals transmitted from and received by the electrostatic capacitance transducer according to the first through eight embodiments have been suppressed, so highly accurate subject information can be acquired.

The probe is reduced in size, so a subject information acquiring device of which handling and operability is good, and easy to use, can be provided.

According to the present invention, an electrostatic capacitance transducer can be provided with reduced capacitance between lines, and suppressed deterioration in conversion efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-144754, filed Jul. 10, 2013, which is hereby incorporated by reference herein in its entirety.

What is claimed is:
1. An electrostatic capacitance transducer, comprising:
a plurality of elements, each of the elements having a cell including
a first electrode, and
a vibrating film including a second electrode, formed across a gap from the first electrode;
a first flexible printed circuit having a plurality of first lines; and
a second flexible printed circuit having a plurality of second lines;
wherein a part of the plurality of elements are grouped into a first element group, each one of the elements of the first element group being electrically connected to a different one of the first lines;
wherein a part of the plurality of elements other than the first element group are grouped into a second element group, each one of the elements of the second element group being electrically connected to a different one of the second lines; and
wherein the intervals between adjacent lines in at least part of the plurality of first and second lines are wider at an opposite side from a connection side where the lines have been connected to the plurality of elements, than at the connection side, and
wherein a length of the first flexible print circuit concerning a direction of the first line is substantially equal to a length of the second flexible print circuit concerning a direction of the second lines.

2. The electrostatic capacitance transducer according to claim 1,
wherein at least part of regions at the opposite sides of the first and second flexible printed circuits are overlaid in the thickness direction of the first and second flexible printed circuit.

3. The electrostatic capacitance transducer according to claim 2,
wherein the first and second flexible printed circuits have bent regions,
and wherein the first and second flexible printed circuits are not overlaid in the thickness direction at the bent regions.

4. The electrostatic capacitance transducer according to claim 2, further comprising:
an insulating sheet, disposed between the first flexible printed circuit and the second flexible printed circuit.

5. The electrostatic capacitance transducer according to claim 1,
wherein the orthogonal projection of the first lines onto the second flexible printed circuit and the orthogonal projection of the second lines onto the second flexible printed circuit are situated such that the first lines are situated between the second lines in at least a part of the regions at the opposite sides.

6. The electrostatic capacitance transducer according to claim 1, further comprising:
an element substrate upon which the plurality of elements are provided;
wherein the first flexible printed circuit is connected to a first end face side of the element substrate, and the second flexible printed circuit is connected to a second end face side of the element substrate which is different from the first end face side of the element substrate.

7. The electrostatic capacitance transducer according to claim 1,
wherein one electrode of the first and second electrodes is an individual electrode electrically divided for each element,
and wherein the other electrode of the first and second electrodes is a common electrode electrically connected among the elements.

8. The electrostatic capacitance transducer according to claim 7,
wherein at least one of the first and second flexible printed circuits further includes a third line to supply DC voltage to the common electrode.

9. The electrostatic capacitance transducer according to claim 7, further comprising:
a third flexible printed circuit having a third line to supply DC voltage to the common electrode.

10. The electrostatic capacitance transducer according to claim 1, wherein the first element group and the plurality of first lines, and the second element group and the plurality of second lines, are electrically connected by an anisotropic conductive film or by wires.

11. The electrostatic capacitance transducer according to claim 1, further comprising:
a first driving circuit electrically connected to the plurality of first lines;
a second driving circuit electrically connected to the plurality of second lines; and
a circuit substrate upon which the first and second driving circuits are provided;
wherein the circuit substrate is disposed on the rear face side of the element substrate from the face where the elements are disposed.

12. A probe, comprising:
the electrostatic capacitance transducer according to claim 1; and
a housing configured to accommodate the electrostatic capacitance transducer;
wherein the plurality of elements perform at least one of transmission and reception of ultrasound waves.

13. A subject information acquiring device, comprising:
the probe according to claim 12; and
a processing unit;
wherein the processing unit acquires subject information using electric signals output from the electrostatic capacitance transducer.

14. An electrostatic capacitance transducer comprising:
a plurality of elements, each of the elements having a cell including
a first electrode, and
a vibrating film including a second electrode, formed across a gap from the first electrode;
a first flexible printed circuit having a plurality of first lines; and
a second flexible printed circuit having a plurality of second lines;
wherein a part of the plurality of elements are grouped into a first element group, each one of the elements of the first element group being electrically connected to a different one of the first lines;
wherein a part of the plurality of elements other than the first element group are grouped into a second element group, each one of the elements of the second element group being electrically connected to a different one of the second lines; and
wherein the intervals between adjacent lines in at least part of the plurality of first and second lines are wider at an opposite side from a connection side where the lines have been connected to the plurality of elements, than at the connection side and
wherein one electrode of the first and second electrodes is an individual electrode electrically divided for each element,
and wherein the other electrode of the first and second electrodes is a common electrode electrically connected among the elements, and
further comprising:
a fourth flexible printed circuit having a fourth line to connect the element substrate upon which the plurality of elements are disposed to a ground potential, the fourth flexible printed circuit being disposed between the first flexible printed circuit and the second flexible printed circuit.

15. The electrostatic capacitance transducer according to claim 14,
wherein the first driving circuit is disposed on one face of the circuit substrate, and the second driving circuit is disposed on the other face of the circuit substrate.

16. An electrostatic capacitance transducer, comprising:
a plurality of elements, each of the elements having a cell including
a first electrode, and
a vibrating film including a second electrode, formed across a gap from the first electrode;
a first flexible printed circuit having a plurality of first lines; and a second flexible printed circuit having a plurality of second lines;

wherein a part of the plurality of elements are grouped into a first element group, each one of the elements of the first element group being electrically connected to a different one of the first lines;

wherein a part of the plurality of elements other than the first element group are grouped into a second element group, each one of the elements of the second element group being electrically connected to a different one of the second lines; and wherein the intervals between adjacent lines in at least part of the plurality of first and second lines are wider at an opposite side from a connection side where the lines have been connected to the plurality of elements, than at the connection side, and wherein at least part of regions at the opposite sides of the first and second flexible printed circuits are overlaid in the thickness direction of the first and second flexible printed circuit, and wherein the first and second flexible printed circuits have bent regions, and wherein the first and second flexible printed circuits are not overlaid in the thickness direction at the bent regions.

* * * * *